(12) United States Patent
Fujii

(10) Patent No.: US 8,592,959 B2
(45) Date of Patent: Nov. 26, 2013

(54) SEMICONDUCTOR DEVICE MOUNTED ON A WIRING BOARD HAVING A CAP

(75) Inventor: Tomoharu Fujii, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 154 days.

(21) Appl. No.: 12/953,808

(22) Filed: Nov. 24, 2010

(65) Prior Publication Data
US 2011/0127655 A1    Jun. 2, 2011

(30) Foreign Application Priority Data
Nov. 27, 2009   (JP) ................................ 2009-269789

(51) Int. Cl.
*H01L 23/58* (2006.01)
(52) U.S. Cl.
USPC .... 257/664; 257/704; 257/710; 257/E23.193; 438/106
(58) Field of Classification Search
USPC ................... 257/664, 710, E23.193; 438/106
See application file for complete search history.

(56) References Cited

U.S. PATENT DOCUMENTS

| | | | | |
|---|---|---|---|---|
| 5,311,402 A | * | 5/1994 | Kobayashi et al. | 361/760 |
| 5,977,631 A | * | 11/1999 | Notani | 257/728 |
| 2002/0025606 A1 | * | 2/2002 | Kurihara et al. | 438/122 |
| 2004/0011699 A1 | * | 1/2004 | Park | 206/710 |
| 2005/0085004 A1 | * | 4/2005 | Lai et al. | 438/100 |
| 2006/0033200 A1 | * | 2/2006 | Nagano et al. | 257/700 |
| 2007/0222048 A1 | * | 9/2007 | Huang | 257/678 |
| 2008/0266821 A1 | * | 10/2008 | Wetzel | 361/757 |

FOREIGN PATENT DOCUMENTS

| | | |
|---|---|---|
| JP | 58-106947 | 7/1983 |
| JP | 58-177946 | 11/1983 |
| JP | 02-016758 | 1/1990 |
| JP | 03-114247 | 5/1991 |
| JP | 7-46709 | 5/1995 |
| JP | 09-232551 | 9/1997 |

OTHER PUBLICATIONS

Notice of Reason for Refusal mailed Jan. 22, 2013 in counterpart application No. 2009-269789.

* cited by examiner

*Primary Examiner* — Thao Le
*Assistant Examiner* — Matthew Gordon
(74) *Attorney, Agent, or Firm* — Kratz, Quintos & Hanson, LLP

(57) ABSTRACT

A semiconductor device includes a semiconductor element, a wiring board including a conductor portion formed on a first surface thereof on which the semiconductor element is mounted, the conductor portion being electrically connected to the semiconductor element, and a concave cap provided to seal the first surface of the wiring board, the concave cap being mounted through an adhesive on the first surface of the wiring board In the semiconductor device, a sidewall portion of the concave cap includes an inside surface facing toward the conductor portion of the wiring board, an outside surface positioned on an opposite side to the inside surface, and a bottom surface adhered onto the first surface of the wiring board. The sidewall portion of the concave cap is provided so that a thickness thereof becomes thinner at a portion extending from the outside surface to the bottom surface. Moreover, a dam-shaped member is provided between the conductor portion of the wiring board and the inside surface of the sidewall portion.

10 Claims, 7 Drawing Sheets

SEMICONDUCTOR DEVICE MOUNTED ON A WIRING BOARD HAVING A CAP

CROSS-REFERENCE TO RELATED APPLICATION

This application is based upon and claims the benefit of priority of the prior Japanese Patent Application No. 2009-269789, filed on Nov. 27, 2009, the entire contents of which are incorporated herein by reference.

FIELD

The embodiments discussed herein are related to a semiconductor device in which a semiconductor element is mounted on a wiring board. More specifically, they relate to a semiconductor device having the following structure: a concave cap is provided on a wiring board with a built-in antenna on which a semiconductor element (chip) including a circuit for high frequency such as millimeter wave band is mounted, the concave cap being provided to seal the chip and conductor portions (bonding wires, wiring layers and the like) electrically connected to the chip with an adhesive such as resin interposed between the cap and the wiring board.

A wiring board in such a semiconductor device is also referred to as a "semiconductor package" or simply "package" in the following description for the sake of convenience in that the wiring board includes a semiconductor chip mounted therein.

BACKGROUND

In a package with a built-in millimeter wave antenna for an IC including a circuit for millimeter wave band (wavelength: 1 mm to 10 mm and frequency: 300 GHz to 30 GHz), considerations should be made on several points in terms of the structure in order to secure required characteristics (high frequency transmission characteristics, antenna directivity and the like) when designing the structure of the package. Although the details are given later, it is at least required that no material having a dielectric constant (adhesive, in particular), not to mention solder resist, should exist in the wiring portion on the package (on the surface side where the cap is provided for sealing).

An example of the technique related to the conventional art is described in Japanese Examined Patent Application Publication No. 7-46709. This document discloses a structure in which an electronic component (semiconductor element) is mounted in a recessed portion (cavity) provided on a base member (substrate) (for example, FIG. 3 and the relevant portions).

An adhesive is used for sealing a package including a semiconductor element and a transmission line for millimeter wave band or the like with a cap. Here, overflow of an adhesive from a cap adhesion portion needs to be suppressed by strictly controlling the amount of the adhesive to be used (application amount) in order to prevent the adhesive from adhering to an undesired portion such as a wiring portion. However, it is extremely difficult to perform control for suppressing such overflow of the adhesive.

SUMMARY

According to one aspect of the invention, there is provided a semiconductor device including a semiconductor element, a wiring board including a conductor portion formed on a first surface thereof on which the semiconductor element is mounted, the conductor portion being electrically connected to the semiconductor element, and a concave cap provided to seal the first surface of the wiring board, the concave cap being mounted through an adhesive on the first surface of the wiring board, wherein a sidewall portion of the concave cap includes an inside surface facing toward the conductor portion of the wiring board, an outside surface positioned on an opposite side to the inside surface, and a bottom surface adhered onto the first surface of the wiring board, and the sidewall portion of the concave cap is provided so that a thickness thereof becomes thinner at a portion extending from the outside surface to the bottom surface, and wherein a dam-shaped member is provided between the conductor portion of the wiring board and the inside surface of the sidewall portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preliminary matters are described for a better understanding of embodiments before explaining the embodiments.

(Preliminary Matters: See FIG. 5)

Figure 7A:
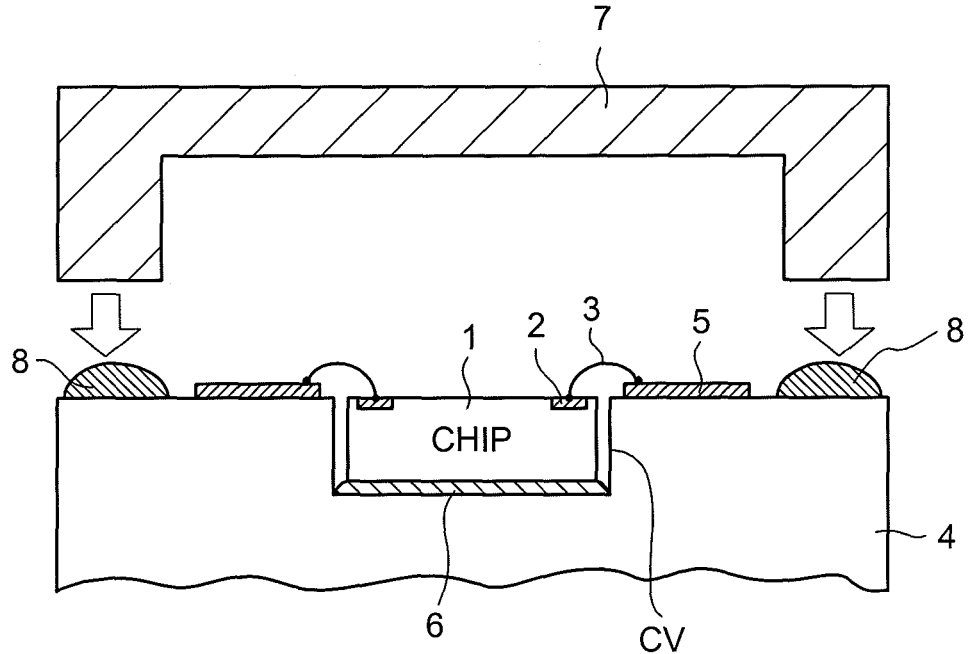
FIGS. 7A and 7B are views for explaining problems with a semiconductor device of a cap sealed structure according to the related art.
Figure 7B:
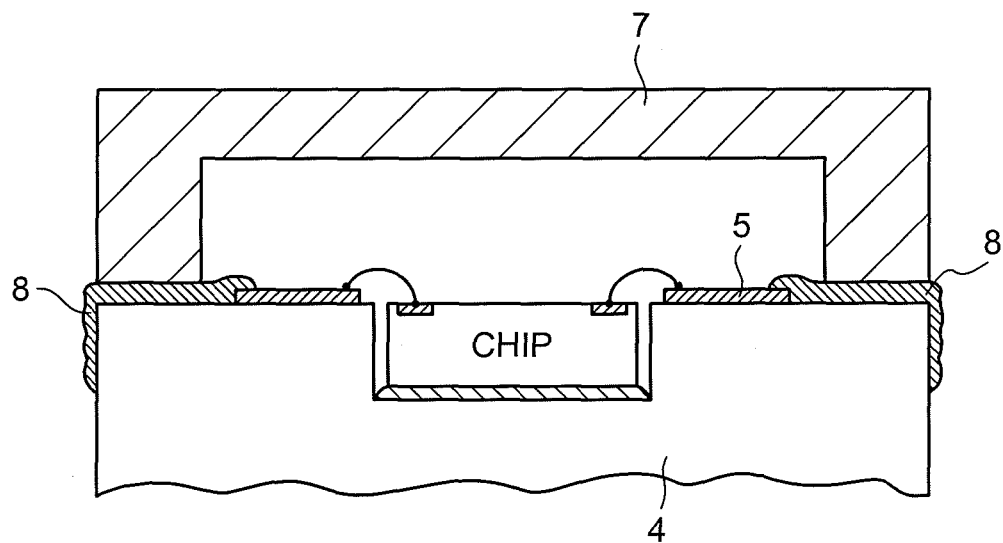

FIGS. 7A and 7B are views for explaining problems with a semiconductor device of a cap sealed structure according to the related art.

As described above, in the case of designing a package with a built-in millimeter wave antenna for an IC including a circuit for millimeter wave band, considerations should be made on several points in terms of the structure in order to secure required characteristics. Here, description is given of these points with reference to FIGS. 7A and 7B.

First, an IC (chip 1) is mounted on a package (wiring board 4) by bonding using wires 3. Where the length (wire length) of each of the wires 3 connecting electrode pads 2 of the chip 1 to pads on the board 4 (portions defined in a portion of a patterned wiring layer 5) becomes long, parasitic inductance increases, thus deteriorating high speed transmission. Accordingly, the chip 1 needs to be arranged in such a manner that the wire length becomes as short as possible. For this reason, a recessed portion (cavity CV) is formed on the package 4, and the chip 1 is mounted in the cavity CV.

The chip 1 is mounted in such a manner that the back surface thereof (surface opposite to the surface side where the electrode pads 2 are formed) is adhered to the bottom surface of the cavity CV via an adhesive 6 applied to the bottom surface. In addition, in order to make the wire length as short as possible, the cavity CV is formed to have a depth approximately equal to the thickness of the chip 1.

Next, a cap 7 having a hollow structure formed to have a recessed shape is used as a cap structure to seal the package 4. Specifically, the chip 1 and the area around the chip 1 (area where the conductor portion (wiring layer 5) connected to the chip 1 via the wire 3 is provided) are sealed by using the recess-shaped cap 7 having the hollow structure, instead of using a general molding resin. Thus, influence on the transmission characteristics of high frequency waves such as millimeter waves is eliminated.

Moreover, the cap 7 and the package 4 are adhered to each other by a thermosetting resin (adhesive 8) such as an epoxy-based resin having heat resistance. The heat resistance of the adhesive 8 can withstand a reflow temperature (for example, around 240 to 260° C.) when an external connection terminal (e.g., a solder ball) is eventually bonded to the mounting surface side of the package 4.

When a cap having a recessed shape is provided to seal the package configured in the manner described above with an adhesive such as an epoxy resin interposed therebetween, overflow of the resin from the cap adhesion portion on the package needs to be suppressed by strictly controlling the amount of adhesive in order to prevent the adhesive resin from attaching to an undesired portion such as a wiring portion. However, such control of an amount of resin is extremely difficult.

For this reason, there may be a case where a portion of the adhesive 8 flows out from the adhesive portion of the cap 7 on the package 4 when the cap 7 is adhered to the package 4 via the adhesive 8 as illustrated in FIG. 7A. In this case, the portion of the adhesive 8 that has flowed out may flow into the inside of the cap 7 as illustrated in FIG. 7B and may be attached to the wiring portion 5 on the package 4. Where the adhesive 8 is attached to the wiring portion 5 on the package 4, particularly in the case where a millimeter wave antenna (not illustrated) in the package 4 is connected to the wiring portion 5, the high frequency transmission characteristics is affected by the dielectric constant or dielectric dissipation factor (which largely depends on the frequency and temperature) of the attached adhesive 8.

In addition, a portion of the adhesive 8 that has flowed out from the adhesive portion of the cap 7 further may flow to the outside of the cap 7 as illustrated in FIG. 7B, and then may be attached to an edge surface of the package (side surface of the package 4). In this case, where the resin (adhesive 8) having a dielectric constant is attached to the side surface of the package, the directivity or the like of the antenna is affected, because electric waves emitted from the built-in antenna of the package 4 is emitted from the edge surface of the package (right side surface of the package 4 in the example illustrated in FIG. 7B).

As described above, the problem with the package structure according to the state of the art is that it is extremely difficult to perform control for suppressing overflow of the adhesive from the cap adhesion portion. This is because conditions such as application amount, fluidity and the like of the adhesive used for sealing a package with a cap need to be established.

Hereinafter the embodiments are described.

First Embodiment

Figure 1A:
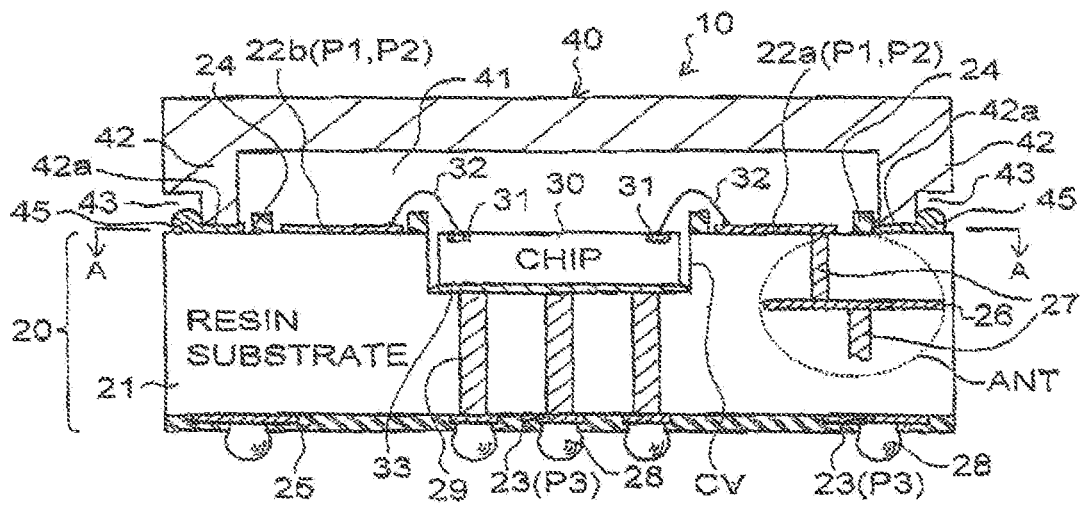
FIGS. 1A and 1B are cross-sectional views along lines A-A and B-B, respectively, in FIG. 2, illustrating a configuration of a semiconductor device according to a first embodiment.
Figure 1B:
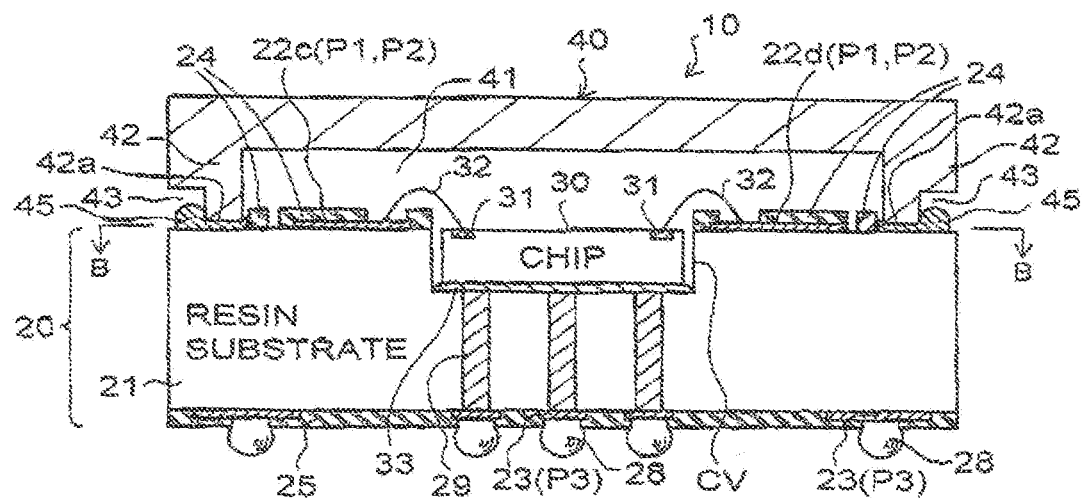
Figure 2:
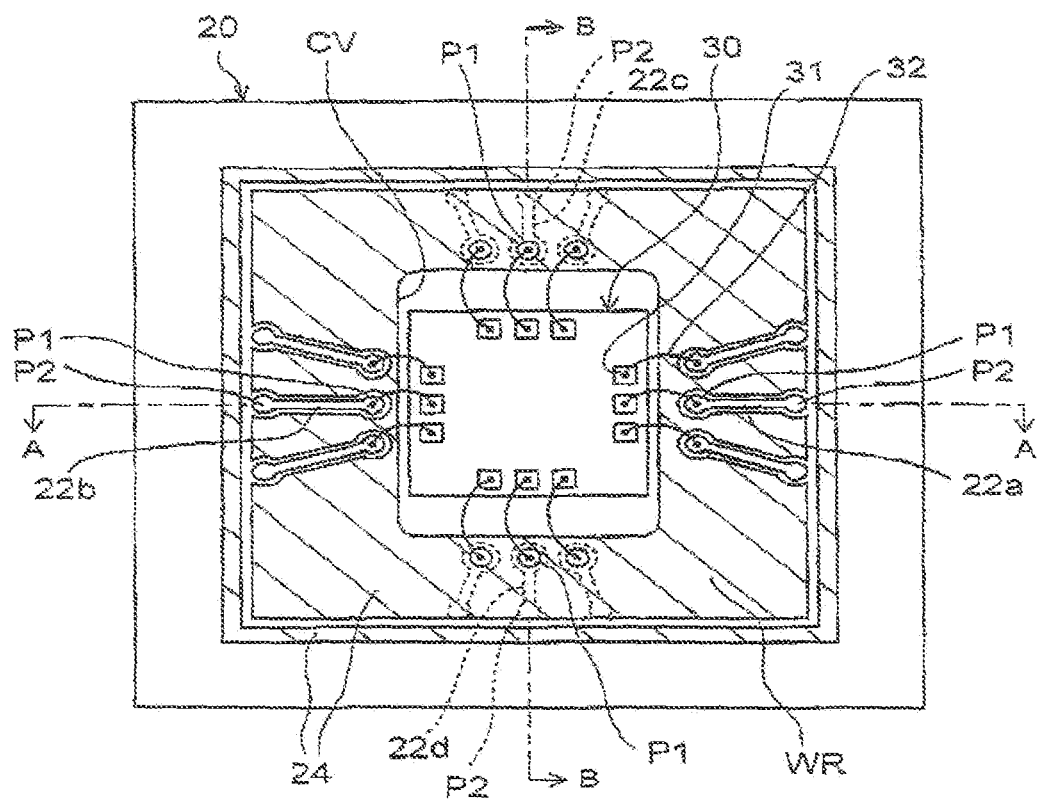
FIG. 2 is a schematic plan view illustrating a configuration of a package portion of the semiconductor device in FIGS. 1A and 1B.

See FIGS. 1A, 1B and 2

FIGS. 1A and 1B illustrate a configuration of a semiconductor device according to a first embodiment, in cross-sectional views. FIG. 2 illustrates a configuration when viewing a package portion of the semiconductor device of FIGS. 1A and 1B, in a schematic plan view.

The semiconductor device 10 according to the embodiment is incorporated and used in a portable terminal device such as a PDA (Personal Digital Assistance) adapted to perform large amount of data communications such as image transmission, for example. The semiconductor device 10 has a wiring board (package) 20, a semiconductor element (chip) 30 mounted on one of surfaces of the wiring board 20, and a cap 40 having a recessed shape and provided to seal the chip 30 and conductor portions (bonding wires 32, wiring layers 22*a* and the like) connected to the chip 30.

The wiring board (package) 20 has a resin substrate 21 forming the main body of the board. As the resin substrate 21, a substrate configured as follows is sufficient: at least wiring layers 22 (a, b, c and d) and 23 are formed respectively on both of outermost surfaces of the substrate, and the wiring layers 22 and 23 are electrically connected to each other through an inner portion of the substrate.

A wiring layer 26 may be formed inside the resin substrate 21 as illustrated but it is not required. In a case where wiring layers are formed inside the resin substrate 21, the outermost wiring layers 22 and 23 are electrically connected to each other through the wiring layers formed inside the substrate with a resin layer (insulating layer) interposed therebetween (in the example of FIGS. 1A and 1B, only a single wiring layer, which is the wiring layer 26, is illustrated for simplicity of illustration) anti via holes (conductor filled into the via holes: vias 27) mutually connecting the wiring layers. A build-up process can be used to form the substrate of this configuration, for example. Meanwhile, in a configuration having no wiring layer formed inside the resin substrate, the outermost wiring layers are mutually connected to each other via through holes (conductor filled into the through holes) appropriately formed at required positions in the resin substrate.

Typically, copper (Cu) is used for the material of the wiring layers 22, 23 and 26 and the vias 27. In addition, a thermosetting epoxy-based resin, polyimide-based resin or the like is preferably used as a material of the resin layer (insulating layer).

Furthermore, solder resist layers 24 and 25 (outermost insulating layers) each serving as a protection film are formed on the both surfaces of the package 20 so as to cover the surfaces thereof, respectively, while exposing portions of pads P1, P2 and P3 defined at required positions of the outermost wiring layers 22 and 23. However, as described later, among the wiring layers 22 (*a*, *b*, *c* and *d*) on the surface side to be sealed by the cap 40, the wiring layers 22*a* and 22*b* have their wiring portions exposed together with their pads P1 and P2, and the wiring layers 22*c* and 22*d* only have their pads P1 exposed.

On the other hand, an appropriate surface treatment is applied to the pads P3 to improve contact properties, the pads P3 exposed from the solder resist layer 25, which is on the surface side opposite to the surface side to be sealed. This is because external connection terminals (solder balls 28 in the illustrated example) for use in mounting the semiconductor device 10 on a motherboard or the like are bonded respectively to the pads P3. Typically, nickel (Ni) plating and gold (Au) plating are applied on the pads P3 (Cu) in the order named. In this case, the Ni plating layer functions as a barrier metal film.

Note that, the solder balls 28 (external connection terminals) are provided respectively to the pads P3 in the example illustrated in FIGS. 1A and 1B, but the solder balls are not necessarily provided. Basically, it is sufficient as long as the pads P3 are exposed so as to allow the external connection terminals (solder balls, metal pins or the like) to be bonded thereto when necessary.

Moreover, a dam-shaped member (denoted by same reference numeral 24 as the solder resist layer 24 for the sake of convenience) formed of a portion of the solder resist layer 24 is provided in a square ring shape between a portion on the package 20 to which the cap 40 is adhered and a region where the wiring layers 22 (a, b, c and d) are formed. This dam-shaped member (solder resist layer) 24 is provided for preventing an adhesive 45 from flowing out to the wiring portion on the package 20. The adhesive 45 is used in sealing with the cap 40 as described later.

The wiring board (package) 20 has a square shape when viewed in a plan view as illustrated in FIG. 2. The size and thickness of the wiring board 20 are selected to be approximately 15 mm×15 mm and 1 mm, respectively. Further, a cavity CV for mounting and housing a semiconductor element (chip) 30 in the board is formed in an approximately center portion of one of surfaces of the package 20. The cavity CV is formed to have a rectangular shape (rectangle) as illustrated in FIG. 2, and the four corners thereof are rounded. The size of the cavity CV is selected to be approximately 6 mm in length in the long direction, approximately 4 mm in length in the short side direction and approximately 300 μm in depth.

The chip 30 to be mounted in the cavity CV is a silicon chip (also called a "die") obtained by dicing multiple devices on a silicon wafer into device units, the multiple devices fabricated on the silicon wafer by application of a required device process. The chip 30 is mounted in the cavity CV in a face-up manner in which the surface including electrode pads (terminals) 31 formed thereon are faced up. For example, a conductive paste (obtained by dispersing metal fine particles of Ag, Cu or the like into a thermosetting resin such as an epoxy-based resin to form a paste) is applied to the bottom surface of the cavity CV and the chip 30 is placed on this conductive paste (adhesive 33). Then, the conductive paste is cured by heating, and the chip 30 is fixed onto the package 20 (in the cavity CV) (die attach).

The region around the cavity CV on the wiring board (package) 20 (region surrounded by the ring-shaped solder resist layer 24) is referred to as a wiring formation region WR (FIG. 2). In the wiring formation region WR, transmission lines (wiring layers 22a and 22b) for high frequency waves such as millimeter wave bands are provided in the regions between the circumferential portions along the long side direction of the cavity CV and the ring-shaped solder resist layer 24 (two regions respectively on the right and left sides of the cavity CV in the example illustrated in FIG. 2). In this embodiment, the wiring layers 22a for 60 GHz (millimeter wave band) are formed in the right wiring formation region while the wiring layers 22b for a high frequency wave with a wavelength longer than the millimeter wave band (20 GHz, 2 GHz or the like) are formed in the left wiring formation region, which is opposite to the right wiring formation region.

On the other hand, wiring layers for input and output (I/O) signal transmission for the chip 30, and wiring layers 22c and 22d for power supply and ground are formed in the regions between the circumferential portion along the short side direction of the cavity CV and the ring-shaped solder resist layer 24 (two regions respectively on the upper and lower sides of the cavity CV in the illustrated example).

The reason for forming the wiring layers 22a and 22b for high frequency waves in the two regions of the wiring formation region WR on the right and left sides of the cavity CV is that the distance between each bonding pad P1 the wiring, and the corresponding electrode pad 31 of the chip 30 (length of each wire 32 serving as a part of the high frequency transmission line) can be reduced. Specifically, the wire length is made short to reduce parasitic inductance generated in the wire portion. Thus, quality deterioration in the signals of high frequency such as millimeter wave bands which is transmitted on the wiring can be suppressed. Incidentally, the gap between the circumferential edge portion along the long side direction of the cavity CV and the bonding pads P1 of the wiring layers 22a and 22b is selected to be at least about 50 μm.

Moreover, an antenna ANT (see FIGS. 1A and 1B) formed inside the resin substrate 21 is connected to the wiring layers 22a for millimeter wave band, which is formed on the front surface of the package 20, via the interlayer connection pads P2 of the wiring layers 22a. In this embodiment, the antenna ANT is formed of a part of the wiring layer 26 inside the substrate and the vias 27 connected thereto as illustrated. The form of the antenna ANT is not limited to the illustrated example as a matter of course.

The wiring layers 22c and 22d for I/O signal transmission, power supply, and ground are coated by the solder resist layer 24 with only the bonding pads P1 thereof exposed. When the solder resist layer 24 is formed, a portion thereof is patterned in a square ring shape, thereby, forming the dam-shaped member (solder resist layer) 24 simultaneously. In the example illustrated in FIG. 2, illustration of the portion of the solder resist layer 24, which covers the wiring layers 22c and 22d, corresponds to FIG. 1B.

On the other hand, in order to secure required characteristics, in the wiring layers 22a and 22b for high frequency waves such as millimeter wave bands, the wiring portions thereof are not covered by the solder resist layer 24 and are thus exposed on the surface of the package 20 similarly to the boding pads P1 and the interlayer connection pads P2 (see FIG. 1A). Accordingly, the exposed portions need to be sealed by the cap 40 for protecting the exposed portions from the outside.

Moreover, a required number of thermal vias 29 (via holes for releasing heat, in which Cu plating or the like is applied on an inner wall portion at least) penetrating through the substrate in the thickness direction thereof are formed in the region right below the cavity CV in the package 20. Specifically, the thermal vias 29 are exposed on the bottom surface of the cavity CV and thermally connected to the back surface (surface opposite to the face surface) of the chip 30 via an adhesive layer 33 (cured conductive paste or the like) formed on the bottom surface. Accordingly, the heat generated during operation of the chip 30 is surely transmitted to the thermal vias 29 via the adhesive layer 33. The transmitted heat is further radiated to the outside of the package via the external connection terminals (solder balls 28) thermally connected to the thermal vias 29.

The cap 40 for sealing the package 20 has a structure in which the primary portion thereof is formed in a plate shape and a sidewall portion 42 is integrally formed in the periphery of the plate-shaped portion. Specifically, the cap 40 has a concave structure. The sidewall portion 42 of the concave cap 40 is formed in a square ring shape in accordance with the outer shape of the dam-shaped member (solder resist layer) 24. The sidewall portion 42 has an inside surface 42b facing toward the wiring layers 22a to 22d, an outside surface 42c positioned on the opposite side to the inside surface 42b, and a bottom surface 42a to be adhered onto the package 20. The concave cap 40 is fixed onto the package 20 by the adhesive 45 (e.g., a thermosetting resin such as an epoxy resin, acrylic resin or silicone resin) interposed between a bottom surface 42a of the sidewall portion 42 and the corresponding portion on the package 20 (adhesive portion).

As a material of the cap 40, an epoxy-based resin is used. The cap 40 can be fabricated by the following manner, for example.

First, an epoxy-based resin member is prepared which is formed with a size matching the square shape (approximately, 15 mm×15 mm) of the package 20 and with a required thickness (thickness corresponding to the height of the cap 40) (cured resin body). Next, a recessed portion 41 for sealing the chip 30 mounted on the package 20 and the conductor portions (bonding wires 32, wiring layers 22a and the like) electrically connected to the chip 30 is formed on the formed resin body by cut processing such as router processing. Then, a step portion 43 is further formed.

As illustrated in the drawing, the step portion 43 (recessed portion) is formed in an outside portion of the sidewall portion 42 of the cap 40. Specifically, the sidewall portion 42 is formed in such a way that the thickness thereof becomes thinner at the portion extending from the outside surface 42c to the bottom surface 42a. The step portion 43 functions as a "resin holding portion." Specifically, when an extra portion of the resin (adhesive 45) melted at the time of sealing with the cap 40 overflows to the outside as described later, the resin holding portion prevents the overflowing resin from flowing out to an edge surface of the package.

This step portion 43 is positioned outside the ring-shaped solder resist layer 24 (dam-shaped member) formed on the wiring board 20, and is provided in a ring shape along the outer circumferential portion of the sidewall portion 42 of the cap 40. Note that, the step portion 43 (recessed portion) does not have to be continuous in a ring shape, and may be formed intermittently as appropriate to match the overflow amount of the extra portion of the adhesive 45 which overflows to the outside at the time of sealing with the cap 40.

Note that, the thickness of the sidewall portion 42 of the cap 40 is selected to be approximately 1 mm, while each of the depth (thickness direction of the sidewall portion 42) and the width (length direction of the sidewall portion 42) of the step portion 43 (recessed portion) formed in the sidewall portion 42 is selected to be approximately 100 μm.

As described above, with the configuration of the semiconductor device 10 according to the first embodiment, firstly, the dam-shaped member 24 formed of a portion of the solder resist layer 24 is provided in a ring shape between the portion on the package (wiring board) 20 where the cap 40 is to be adhered to and the portion on the package 20 along the outer circumference of the wiring formation region WR (region where the interlayer connection pads P2 of the wiring layers 22a, 22b, 22c and 22d are arranged). The dam-shaped member 24 formed in the ring shape can prevent a portion of the adhesive 45 from flowing into the inside of the cap 40, the portion of the adhesive 45 overflowing from the adhesive portion of the cap 40 on the package 20 when the cap 40 is adhered to the package 20 via the adhesive 45.

In other words, none of the portion of the adhesive 45 overflowing from the adhesive portion of the cap 40 adheres to the wiring portion (wiring layers 22a for millimeter wave band in particular) on the package 20. Thus, the influence on the high frequency wave transmission characteristics as observed in the conventional art can be eliminated.

In addition, the recessed portion (step portion 43) is formed in the outside portion of the sidewall portion 42 of the cap 40 to be adhered to the package 20, the outside portion connected to the bottom surface 42a of the sidewall portion 42. Thus, when an extra portion of resin (adhesive 45) melted at the time of sealing with the cap 40 overflows to the outside, the overflowing resin can be held in the step portion 43 (see FIGS. 1A and 1B).

Accordingly, a portion of the adhesive 45 that has overflowed from the adhesive portion of the cap 40 and then flowed outside can be prevented from flowing out to an edge surface of the package. Thus, since none of the adhesive 45 is attached to the edge surface of the package (side surface of the package 20, particularly, side surface where the antenna ANT is formed), the influence on the directivity of the antenna as observed in the conventional art can be eliminated.

As described above, according to the first embodiment, the presence of the dam-shaped member (solder resist layer) 24 provided in a ring shape on the package 20 and the step portion 43 provided on the cap 40 can easily suppress flowing out of the adhesive 45 to the wiring portion or the like, the adhesive 45 used in sealing the package 20 with the cap 40. As a result, required characteristics of the package 20 can be secured.

Moreover, the dam-shaped member 24 in the ring shape can be formed simultaneously with the solder resist layer 24 being the outermost insulating layer by appropriately patterning the corresponding portion of the solder resist layer 24 when the solder resist layer 24 is formed in the process of fabricating the main body of the board (resin substrate 21) of the package 20 (e.g., board fabrication process using a build-up method). Specifically, no additional process is required for providing the dam-shaped member 24. Thus, there is no increase in the cost.

Moreover, the dam-shaped member (solder resist layer) 24 is provided in the square ring shape (see FIG. 2), and the sidewall portion 42 of the cap 40 is formed in accordance with the outer shape of the dam-shaped member 24. Thus, when the package 20 is sealed with the cap 40, the cap 40 can be relatively easily positioned on the package 20.

Second Embodiment

Figure 3A:
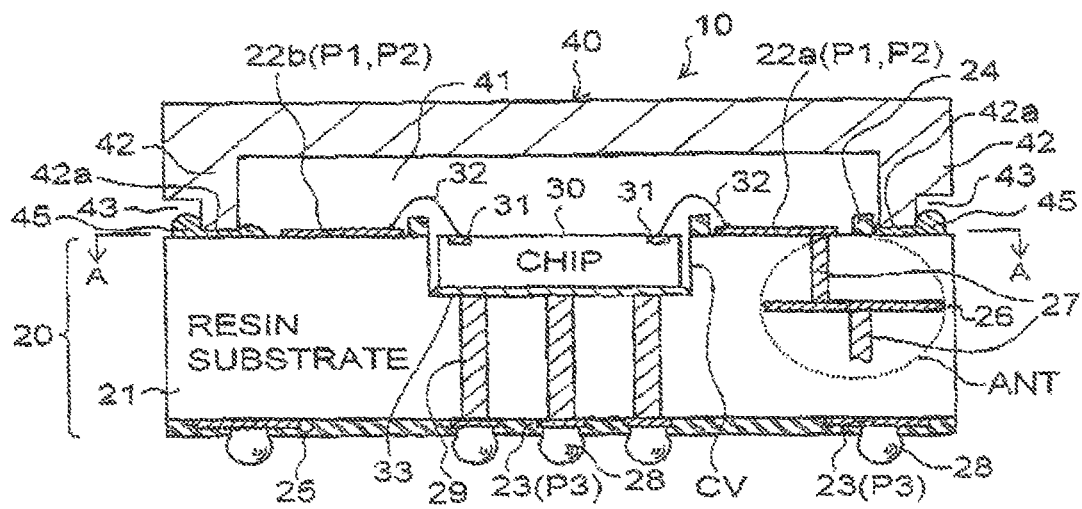
FIGS. 3A and 3B are cross-sectional views along lines A-A and B-B, respectively, in FIG. 4, illustrating a configuration of a semiconductor device according to a second embodiment.
Figure 3B:
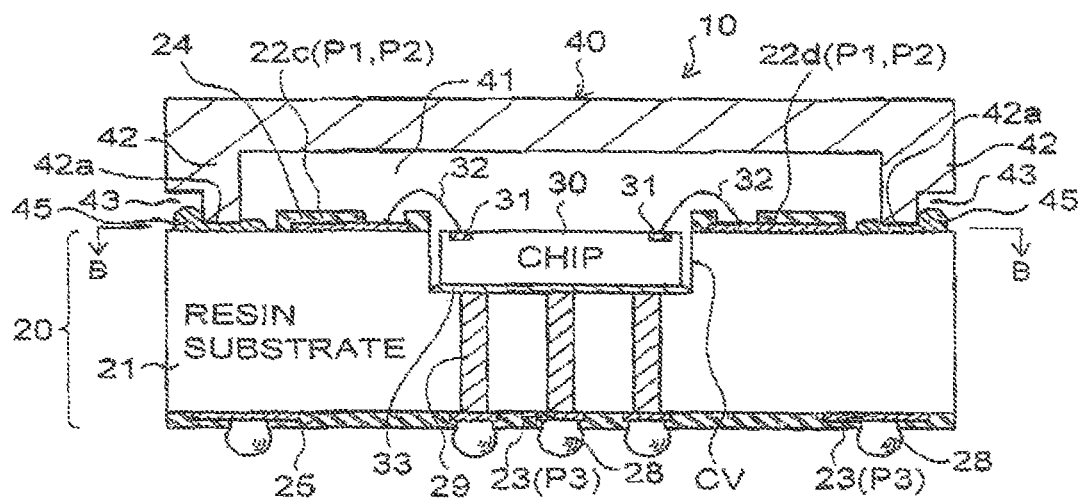
Figure 4:
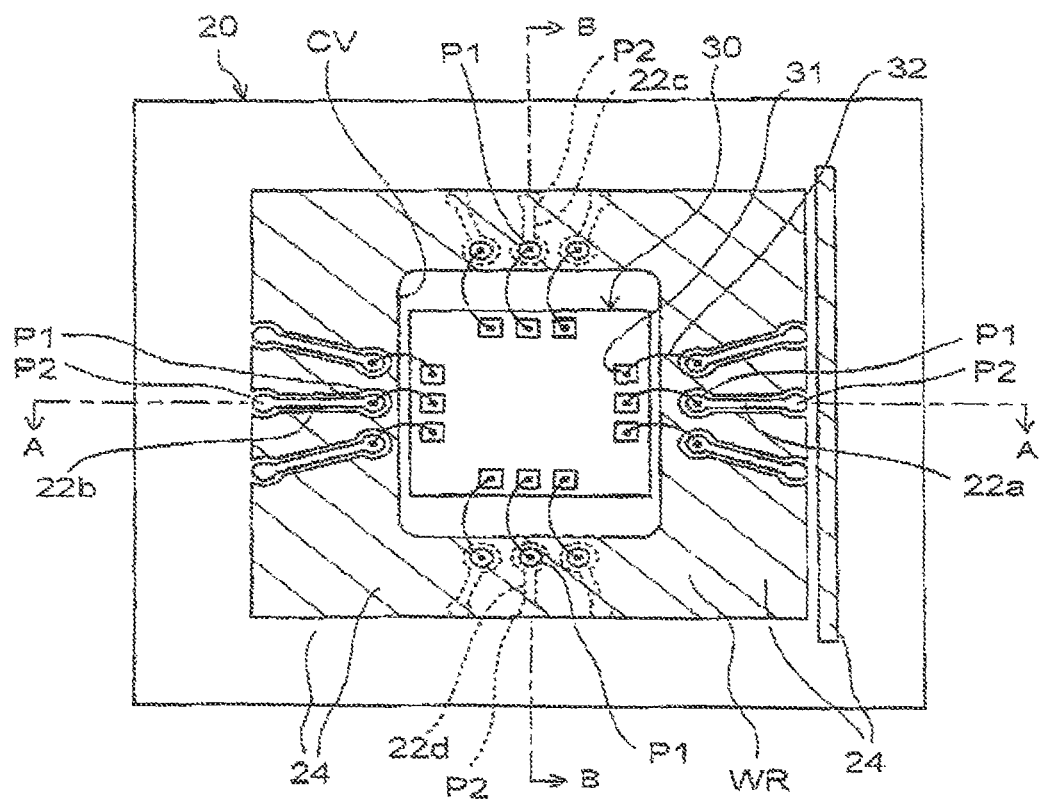
FIG. 4 is a schematic plan view illustrating a configuration of a package portion of the semiconductor device in FIGS. 3A and 3B.

See FIGS. 3A, 3B and 4

FIGS. 3A and 3B illustrate a configuration of a semiconductor device according to a second embodiment, in cross-sectional views. FIG. 4 illustrates a configuration when viewing a package portion of the semiconductor device, in a schematic plan view.

As compared with the configuration of the semiconductor device 10(FIGS. 1A and 1B) according to the first embodiment, the semiconductor device 10a according to the second embodiment (FIGS. 3A and 3B) is different in that a dam-shaped member 24a formed of a portion of the solder resist layer is linearly provided, among areas in the wiring portion formed on the wiring board 20a, only in an area near the region where wiring layers 22a for millimeter wave band are formed. The other configuration of the semiconductor device 10a is the same as in the case of the first embodiment. Accordingly, description of the other configuration is omitted herein.

In the aforementioned first embodiment, the dam-shaped member 24 (solder resist layer) is provided in a ring shape (FIG. 2), and a slight gap exits between the outside surface of the dam-shaped member 24 and the inside surface 42b of the cap 40 (sidewall portion 42). Accordingly, when the package 20 is sealed with the cap 40, the case where the cap 40 is not always easily and accurately positioned on the package 20 may be expected.

On the other hand, in the second embodiment, the dam-shaped member 24a (solder resist layer) is partially ("linearly" in the illustrated example) provided only at the position to which the resin (adhesive 45) overflowing from the adhesive portion on the package 20a is not allowed to attach at the time of adhering the cap 40, i.e., only at the position near the region where the wiring layers 22a for millimeter wave band are formed, the wiring layers 22a having the characteristics that may be affected. In this configuration, the cap 40 can be easily and accurately positioned on the package 20a by pressing the corresponding inside surface 42b of the cap 40 (sidewall portion 42) against the outside surface of the dam-shaped member 24a so as to be in contact therewith when the package 20a is sealed with the cap 40.

In this case, the inside surface 42b of the cap 40 (sidewall portion 42) and the outside surface of the dam-shaped member 24a are in close contact with each other without any gap formed therebetween. Accordingly, the extra portion of the adhesive 45 melted at the time of sealing with the cap 40 flows only to the outside of the cap 40 without flowing into the inside of the cap 40, and thus is held in the step portion (recessed portion) 43.

Note that, as illustrated in FIGS. 3A and 3B, the portion of the adhesive 45 overflowing from the adhesive portion on the package 20a slightly flows, at the time of sealing with the cap 40, into the inside of the cap 40 in the portion where no dam-shaped member 24a is provided among the portions on the package 20a where the cap 40 is attached (ring-shaped portion). The portion of the adhesive 45 that has flowed into the inside of the cap 40 is not attached to the wiring layers 22b and stays at a position just before the wiring layers 22b in the illustrated example. Here, even if the portion of the adhesive 45 is attached to the wiring layers 22b, the characteristics are barely affected as compared with the case where the adhesive 45 attaches to the wiring layers 22a for millimeter wave band.

In the aforementioned embodiments, described is an example of the case where the electrode pads 31 of the semiconductor element (chip) 30 mounted on the wiring board 20 (20a) are connected to the corresponding pads P1 on the board via the bonding wires 32. However, the connection between the chip and the pads on the board is not limited to this form as a matter of course.

For example, the invention is applicable in the like manner in the case where the mounting is performed by flip-chip bonding. In this case, the semiconductor chip is flip-chip mounted on the wiring board (package) at a predetermined position (portion where pads of wirings are exposed) in a face down manner. Further, the gap between the chip and the wiring board is filled with underfill resin.

In this case, there is no need to form a cavity for housing a chip, and there is no need to use a tool such as a wire bonder. Thus, there is a merit that the manufacturing process can be simplified. However, the underfill resin has a dielectric constant corresponding thereto. Thus, in considering that the dielectric constant of the underfill resin has more than a little influence on the high frequency wave characteristics, measures have to be taken such as using a material having a dielectric constant as low as possible as the underfill rein.

Moreover, in the aforementioned embodiments, there is described an example of the case where the recessed portion 43 provided on the outside portion of the sidewall portion 42 of the cap 40 is formed in a "step shape". However, it is of course that the shape of the recessed portion is not limited to this case. Basically, it is sufficient if the recessed portion is formed in a shape capable of preventing an extra adhesive from flowing out to an edge surface of a package (see FIG. 7B), the extra adhesive flowing out from the adhesive portion when a cap is adhered (sealed) onto the package. For example, the recessed portion may be formed in a tapered shape as illustrated in FIGS. 5 and 6.

Figure 5:
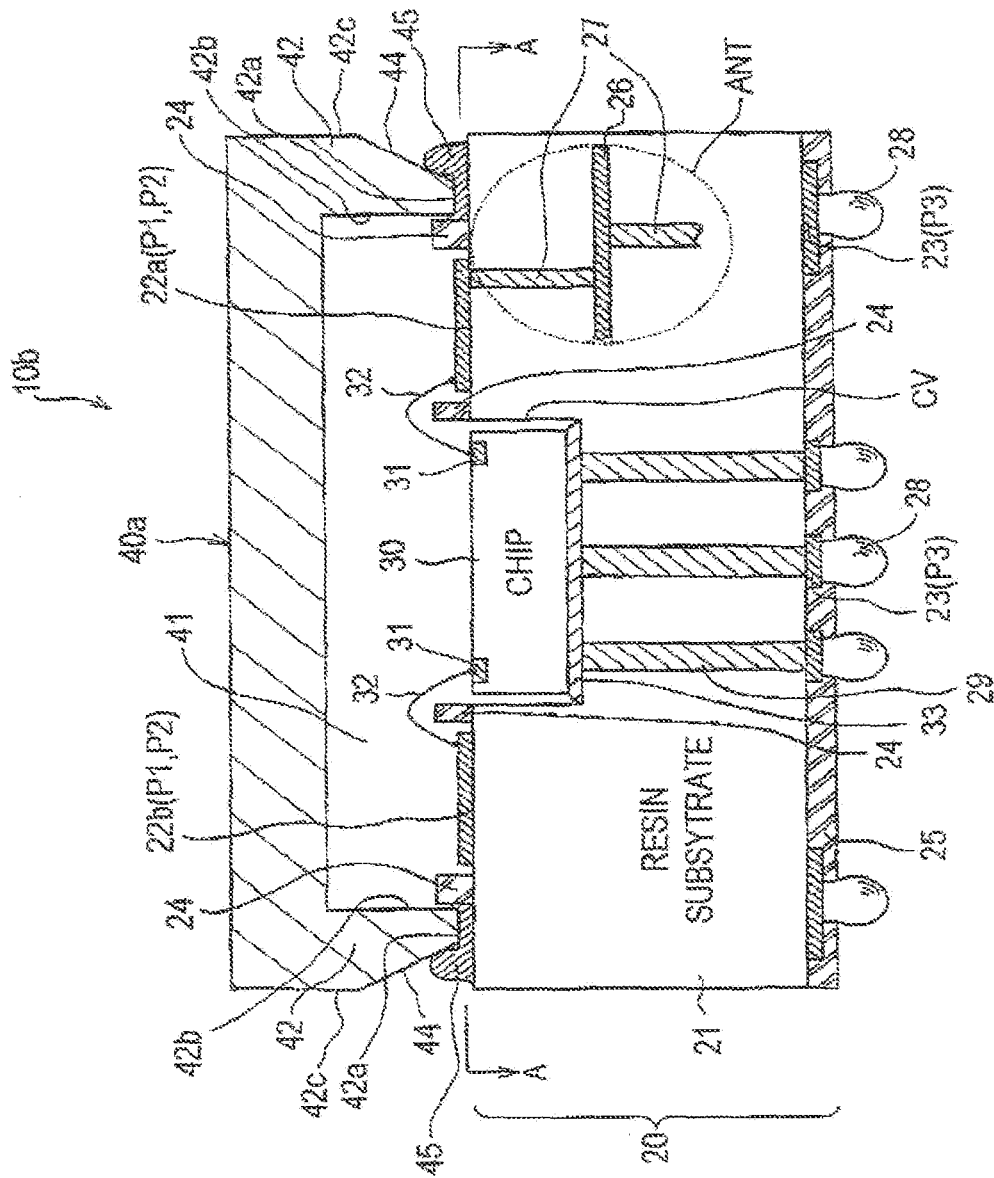
FIG. 5 is a cross-sectional view in modification of FIG. 1A illustrating a configuration of a semiconductor device according to a modification of the embodiment FIGS. 1A and 1B.

FIG. 5 illustrates a configuration of a semiconductor device according to a modification of the embodiment of FIGS. 1A and 1B, in a cross-sectional view. As compared with the configuration of the semiconductor device 10 of FIGS. 1A and 1B, the semiconductor device 10b according to this embodiment (FIG. 5) is different in that the sidewall portion 42 of the concave cap 40a exhibits a tapered shape (taper surface 44) at the portion extending from the outside surface 42c to the bottom surface 42a. Namely, the thickness of the sidewall portion 42 is gradually reduced in the direction from the outside surface 42c to the bottom surface 42a. The other configuration of the semiconductor device 10b is the same as in the case of the embodiment of FIGS. 1A and 1B, and thus the explanation thereof is omitted herein.

Figure 6:
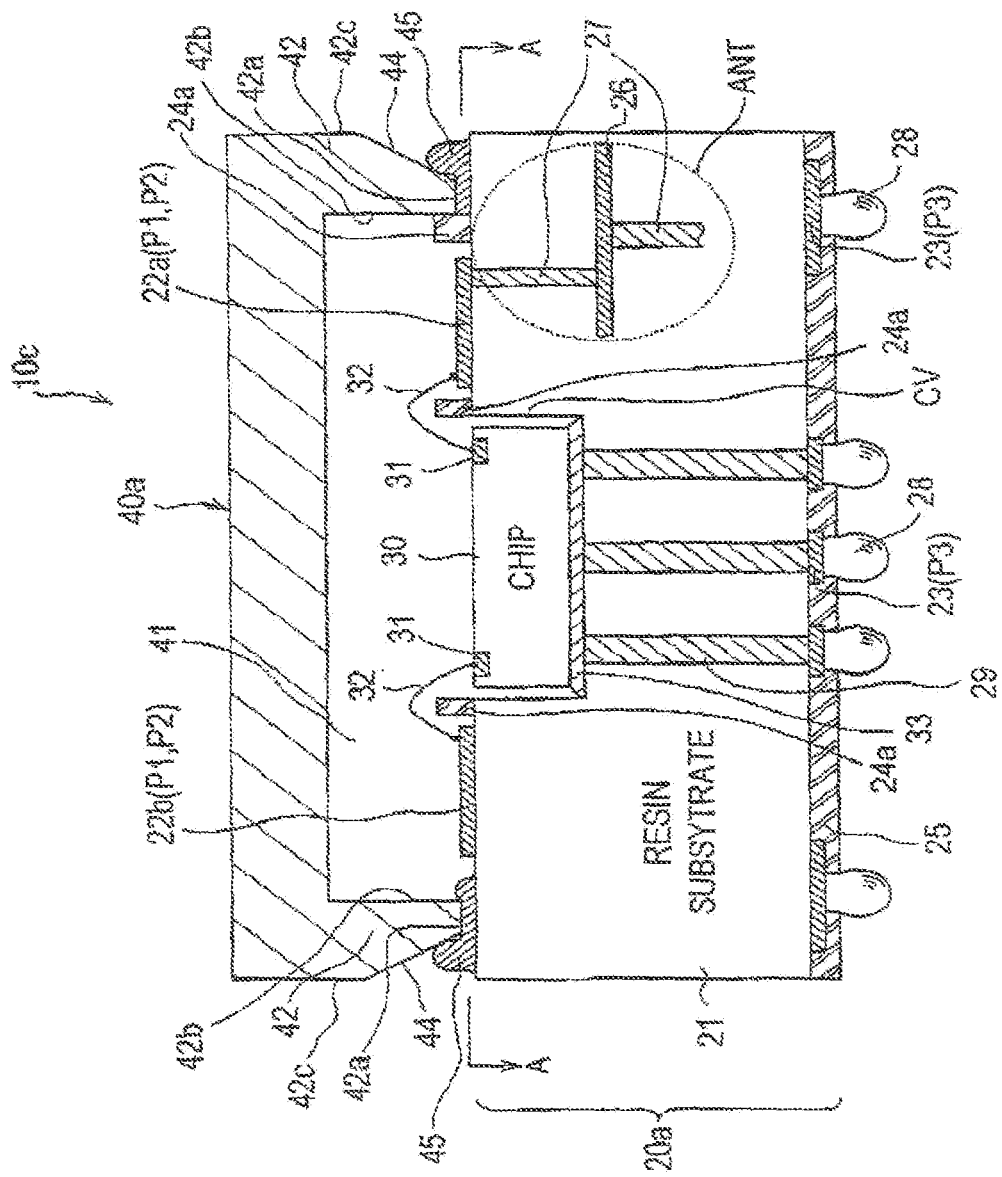
FIG. 6 is a cross-sectional view in modification of FIG. 3A illustrating a configuration of a semiconductor device according to a modification of the embodiment of FIGS. 3A and 3B.

FIG. 6 illustrates a configuration of a semiconductor device according to a modification of the embodiment of FIGS. 3A and 3B, in a cross-sectional view. As compared with the configuration of the semiconductor device 10a of FIGS. 3A and 3B, the semiconductor device 10c according to this embodiment (FIG. 6) is different in that the sidewall portion 42 of the concave cap 40a exhibits a tapered shape (taper surface 44) at the portion extending from the outside surface 42c to the bottom surface 42a. The other configuration of the semiconductor device 10c is the same as in the case of the embodiment of FIGS. 3A and 3B, and thus the explanation thereof is omitted herein.

Further, in the aforementioned embodiments, an example of the case where a resin substrate is used as the wiring board (package) is described. However, the wiring board is not limited to a resin substrate as a matter of course. The invention can be applied in the like manner to the case where a ceramic substrate is used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a semiconductor element;
    a wiring board including
    a first surface of a resin substrate and a second surface of the resin substrate opposite to the first surface,
    a cavity which is formed in the first surface of the resin substrate and in which the semiconductor element is mounted, and a wiring layer for a high frequency wave and another wiring layer in each of which first and second pads are defined at both ends and which are formed on the first surface thereof around the cavity, each of the wiring layer and the another wiring layer being electrically connected to the semiconductor element through the first pad;

an outermost insulating layer Which is formed of a solder resist layer and is on each of the first surface and the second surface, the outermost insulating layer on the first surface being comprised of a first outermost insulating layer from which the wiring layer for the high frequency wave, the first and second pads of the wiring layer for the high frequency wave are exposed and with which the another wiring layer and the second pad of the another layer are covered other than the first pad of the another wiring layer, and a second outermost insulating layer provided at an outer peripheral position than a forming region of the first outermost insulating layer, the second outermost insulating layer comprising a dam-shaped member; and a concave cap provided to seal the first surface of the wiring board, the concave cap being mounted at an outer peripheral position than a forming region of the second outermost insulating layer on the first surface of the resin substrate, wherein a sidewall portion of the concave cap includes an inside surface facing toward each of the layer and the another wiring layer of the wiring board, an outside surface positioned on an opposite side to the inside surface, and a bottom surface adhered through an adhesive onto the first surface of the resin substrate, and the sidewall portion of the concave cap is provided so that a thickness thereof becomes thinner at a portion extending from the outside surface to the bottom surface, and wherein the dam-shaped member is provided between the first outermost insulating layer and the inside surface of the sidewall portion.

2. The semiconductor device according to claim 1, wherein the inside surface of the sidewall portion of the concave cap is pressed against a corresponding outside surface of the dam-shaped member so as to be in contact therewith.

3. The semiconductor device according to claim 1, wherein the dam-shaped member is provided in a ring shape in accordance with a shape of an inner circumferential portion of the sidewall portion of the concave cap.

4. The semiconductor device according to claim 1, wherein the dam-shaped member is partially provided, among the wiring layer for the high frequency wave and the another wiring layer, only near the wiring layer.

5. The semiconductor device according to claim 1, wherein the sidewall portion of the concave cap exhibits a step shape or a tapered shape at the portion extending from the outside surface to the bottom surface.

6. The semiconductor device according to claim 1, the wherein the semiconductor element is mounted in a cavity formed on first surface of the wiring board.

7. The semiconductor device according to claim 1, wherein the wiring board includes a transmission line for high frequency waves around the cavity, and an antenna formed inside the wiring board and connected to the transmission line.

8. The semiconductor device according to claim 1, wherein the semiconductor element is mounted on a cavity formed in the wiring board.

9. The semiconductor device according to claim 8, wherein a thermal via for releasing heat, which penetrates through the wiring board in the thickness direction thereof, are formed in the region below the cavity.

10. The semiconductor device according to claim 1, wherein a material of the cap is an epoxy-based resin.

* * * * *